United States Patent
Huang et al.

(10) Patent No.: US 7,151,052 B2
(45) Date of Patent: Dec. 19, 2006

(54) MULTIPLE ETCH-STOP LAYER DEPOSITION SCHEME AND MATERIALS

(75) Inventors: Tai-Chun Huang, Hsin-Chu (TW);
Chih-Hsiang Yao, Taipei (TW);
Kuan-Shou Chi, Hsinchu (TW);
Chin-Chiu Hsia, Taipei (TW);
Mong-Song Liang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 10/908,142

(22) Filed: Apr. 28, 2005

(65) Prior Publication Data

US 2006/0246686 A1 Nov. 2, 2006

(51) Int. Cl.
*H01L 21/4763* (2006.01)
*H01L 23/48* (2006.01)

(52) U.S. Cl. .................. 438/623; 438/618; 438/622; 257/750; 257/758; 257/E21.122

(58) Field of Classification Search ........ 438/584–687; 257/750, 758
See application file for complete search history.

(56) References Cited

U.S. PATENT DOCUMENTS

2001/0045651 A1* 11/2001 Saito et al. .................. 257/750
2004/0121085 A1*  6/2004 Wang et al. ................. 427/569
2004/0238962 A1* 12/2004 Jung et al. ................... 257/758

* cited by examiner

*Primary Examiner*—Michael Lebentritt
*Assistant Examiner*—Mohsen Ahmadi
(74) *Attorney, Agent, or Firm*—Baker & McKenzie LLP

(57) ABSTRACT

Described are methods and structures for mitigating the effects of mechanical stresses placed on the layers of semiconductor devices, and specifically disclosed are methods and structures for mitigating the diminished chemical bonds between etch-stop layers and other semiconductor device layers. The disclosed methods and structures use different structures and/or processes for some of the etch-stop layers in a device.

7 Claims, 7 Drawing Sheets

MULTIPLE ETCH-STOP LAYER DEPOSITION SCHEME AND MATERIALS

TECHNICAL FIELD

This invention relates to semiconductor processing in multiple-layer metallization semiconductor devices using etch-stop layers.

BACKGROUND

The layers that make up a semiconductor device are formed and patterned using what is called a photolithographic process in which a top photoresist layer is selectively hardened and etched by exposing it to a light pattern and etching away the portions of the photoresist that were not exposed to the light. The patterned photoresist is then used as a pattern for etching underlying layers of the semiconductor device.

In many instances, layers that overlie other layers of the semiconductor device should be patterned without that patterning extending down into the underlying layers. But in many cases the underlying layer would be affected in the same way by an etchant as the layer being etched. To prevent the etching of underlying layers, layers called etch-stop layers can be interposed between the layer to be etched and its underlying. For example, an etch-stop layer may be deposited over a metal layer in order to stop the etching of an insulating layer that overlies the metal layer. In this way, an etchant that is selective—having a substantially higher etch rate—to the overlying insulating layer relative to the etch-stop layer will be stopped or dramatically slowed upon reaching the etch-stop layer. A second etchant can then be used if desired to remove the etch-stop layer in areas exposed by the first etching process, where the second etchant can be chosen to be selective to the material used for etch-stop layer relative to the underlying metal layer. And in fact this process can continue in turn to further underlying layers.

The difficulty with using etch-stop layers is that the etch-stop layers may introduce diminished chemical adhesion in the stack of layers of the semiconductor device. This diminished chemical adhesion is particularly troublesome in applications where the device is exposed to greater mechanical stresses, such as underneath a wire-bonding pad. A wire-bonding pad introduces mechanical stresses onto the underlying semiconductor layers both during the manufacturing process and during subsequent device operation. For example, to attach a wire-bonding pad to a semiconductor device, a heated metal ball is pressed onto a contact pad on the semiconductor device. In order to form a metallic bond to the contact pad, pressure is applied between the metal ball and the contact pad. This pressure imposes uneven stresses underneath the contact pad, and the stresses and flexures can cause underlying layers to, for example, peel apart from each other.

Further, even after the metal ball is bonded to the contact pad of the semiconductor device, temperature cycling and other physical stresses on the final, packaged semiconductor device can cause relative movement between the wire-bond pad and the underlying layers of the semiconductor device. These stresses can cause the chemical adhesion between the layers to be broken and can also cause the layers to peel loose from each other. As mentioned, the bonds to the etch-stop layers may be particularly susceptible to peeling.

SUMMARY

Described herein are methods and structures for mitigating the effects of mechanical stresses placed on the layers of semiconductor devices, and specifically disclosed are methods and structures for mitigating the diminished chemical bonds between etch-stop layers and other semiconductor device layers. The disclosed methods and structures use different structures and/or processes for some of the etch-stop layers in a device. For example, if a semiconductor manufacturing process uses four etch-stop layers, three of the etch-stop layers may be formed of silicon carbide (SiC), and the other of the etch-stop layers may be formed of silicon carbide oxide (SiCO), silicon carbide nitride (SiCN), or silicon nitride ($Si_3N_4$). The division of structures and/or processes can be broken out according to design goals. For example, two of four layers may be one of the above-referenced materials and the other two layers can be another.

The processes and materials used can be broken out in various combinations depending on design goals, such as according to the relative stresses placed on the various layers within the stack. The top-most layer will likely see the highest mechanical stress. Accordingly, in certain embodiments the top etch-stop layer may be optimized to have the strongest chemical bonds with other layers, even though that may introduce greater manufacturing expense and processing difficulty because that top-most layer may be more difficult to form from a semiconductor manufacturing process. Another possible structure for forming a multiple layer etch-stop semiconductor stack includes applying adhesive layers (e.g., 20–50 angstroms) between the etch-stop layers and other layers. Other processes can also be used to enhance the chemical bonds between the etch-stop layers and other layers. For example, the process may include copper oxide (CuO) reduction—through hydrogen ($H_2$) or ammonia ($NH_3$) treatment.

Other processes and materials that can be used to enhance certain of the higher-stress photoresist layers include using copper nitride (CuN) formation through ammonia ($NH_3$) treatment. The layers may be deposited at 300 to 400° Celsius at a power of 150 to 800 watts. Using film deposition powers and pressure ranges commonly known to those in the industry, it may be desirable to use different processes to increase the chemical bond at one or more of the etch-stop layers, such as by exposing one or more of the etch-stop layers to helium or argon in order to increase the layer's surface roughness.

BRIEF DESCRIPTION OF THE DRAWINGS

Embodiments are illustrated by way of example in the accompanying figures, in which like reference numbers indicate similar parts, and in which.

The above-referenced drawings, and the description that accompanies them, are for certain embodiments. The claims, however, are not to be limited to any specific embodiment or illustration.

DETAILED DESCRIPTION

Figure 1:
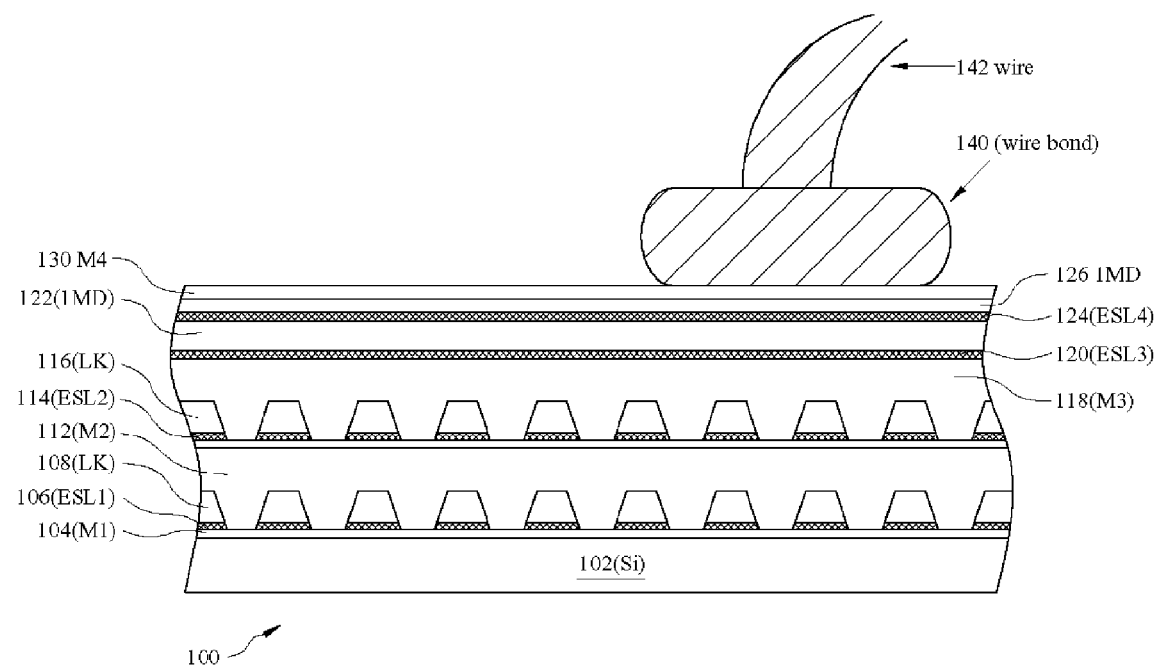
FIG. 1 is a cross-sectional diagram of a four-metal-layer semiconductor device including a bonding pad and wire bond mounted at its top.

FIG. 1 illustrates a cross-sectional diagram of a semiconductor device 100 having four metal layers 104, 112, 118, 130, and in which etch-stop layers 106, 114, 120, 124 are used. The etch-stop layers stop the etching after the etching reaches through the overlying dielectric layers 108, 116, 122, 126, which include low-K dielectric material, thereby keeping the etching from eating into the substrate 102 or metal layers 104, 112, 118. In the illustrated example, the etching is done to form the contact holes 105 and vias 110 that are used, respectively, to connect the second metal layer 112 to the first metal layer 104/substrate 102 and to connect the subsequent metal layers 112, 118, 130 to each other. FIG. 1 has been simplified in that it does not explicitly illustrate the connections between the third and fourth metal layers, but the processes and structure for those connections would be similar to the ones for forming the contact holes 105 and vias 110 previously described.

The specific structure of the semiconductor device 100, beginning from the bottom, is as follows. The bottom or lowest layer is the substrate 102, which may be a silicon substrate or another type of crystalline semiconductor. The substrate 102, however, could also be a polysilicon structure grown upon an insulator (silicon-on-insulator technology) or upon another silicon layer. Above the substrate in this embodiment, a first metal layer 104 is proved, although as with all of the embodiments described herein, the actual layers chosen constitute design choices and do not constitute inventive requirements. The scope of what is claimed in this application shall be construed according to the claims and should not be limited by specific embodiments disclosed in the application.

A low-K dielectric 108 provides insulation between the second metal layer 112 and the first metal layer 104/substrate 102. To make the contact between the second metal layer 112 and substrate 102, contact holes 105 are etched into the dielectric layer 108. Without an etch-stop layer, the same etchant that would form the contact holes 105 in the dielectric layer 108 might also continue etching down into the metal layer 104 and/or substrate 102. The etch-stop layer 106, however, will prevent over-etching down into the metal layer 104 and/or substrate 102, as the etch-stop layer 106 and the etchant will be selected such that the etchant will be selective to the dielectric layer 108 over the etch-stop layer 106.

After the etching of the contact holes 105 is completed, a second etchant is applied to remove the remaining etch-stop layer 106 from within the contact holes 105. The second etchant will be selective to the etch-stop layer 106 relative to the underlying metal layer 104 and/or substrate 102. In this way, over-etching into those underlying layers can be avoided. Once the contact holes 105 have been formed as described, the second metal layer 112 can be deposited over the entire patterned insulating layer 108, and the metal layer will also be deposited down into the contact holes 105 to make contact with the underlying first metal 104/silicon substrate 102. This process is repeated with the overlying insulating layers and metal layers using the etch-stop layers 114, 120, 124 to form subsequent vias 110 and other structures, to form connections between subsequent metal layers, and to avoid over-etching into underlying metal layers in the illustrated example. Etch-stop layers can, however, be used to protect underlying layers other than metal layers, and the techniques described here will also apply to any of those embodiments.

A final top metal layer may also be formed at the top of the device 100. An aluminum pad may then be formed on top of the top metal layer, in accordance with known techniques. The aluminum pad may also be surrounded by nitride passivation and if included provides at least a contact pad for the wire bond 140, which is at the end of the bonding wire 142. In known semiconductor packaging processes, the wire 142 and wire bond 140 are used to connect the device 100 to a package (not shown) in which the device 100 is mounted. Although this example is provided in the wire bond case, there are other types of bonding techniques that may also include metal pads, metal bonds, or other connections to the silicon substrate. The described approaches provide protection from stress for any of the bonding approaches.

The nature of the bonding attachment to the semiconductor device 100 is that there will be layers of the semiconductor device that will receive more of the stress from the bonding pad than will others. Generally, the stress is distributed more broadly as you move farther away from the bond pad into the device. Thus, the point of highest stress will likely be towards the top of the stack of layers and beneath the wire bond 140. Unless the semiconductor device is carefully designed for a good chemical bond between the layers, there can be peeling or separation between the layers of the semiconductor device. Prior devices have not recognized the particular vulnerability of the higher-level bond etch-stop layers (e.g., 120, 124) and accordingly have not provided for differing processes or materials that are tailored to these upper layers. Described embodiments of this application will, however, describe the use of different materials and process techniques for optimizing the design for maximum strength and processing efficiency.

Figure 2A:
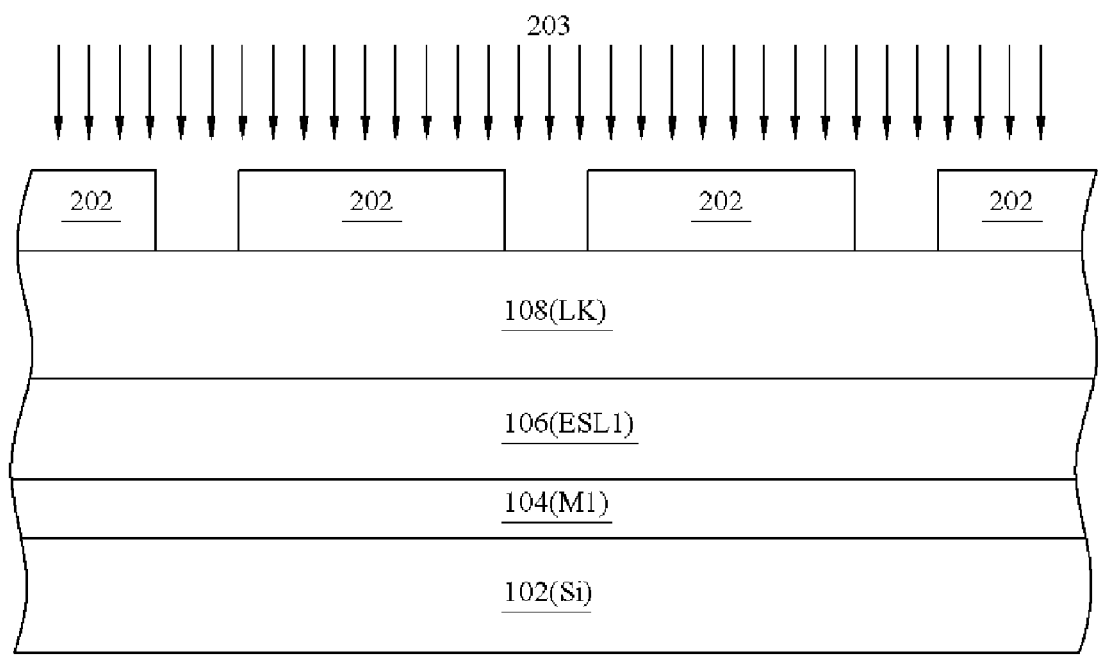
FIGS. 2A–2D are cross-sectional diagrams illustrating a portion of the process for forming a semiconductor device such as is shown in FIG. 1.

FIG. 2A more specifically describes and illustrates a process for using an etch-stop layer 106 to form or etch vertical structures into a semiconductor device 100. In FIG. 2A, a semiconductor substrate 102 is provided and a first metal layer 104, an etch-stop layer 106, and a low-K dielectric layer 108 are deposited, in that order, above the silicon substrate 102. A photoresist layer 202 is deposited above the low-K dielectric 108 in order to define a pattern for subsequent etching. The photoresist layer after patterning provides a barrier to etching in those areas where no etching is desired. The etching process 203 will be selective to the low-K dielectric layer 108 relative to the photoresist layer 202, and also relative to the underlying etch-stop layer 106 in order that the etching not continue down into the metal layer 104/silicon substrate 102.

Figure 2B:
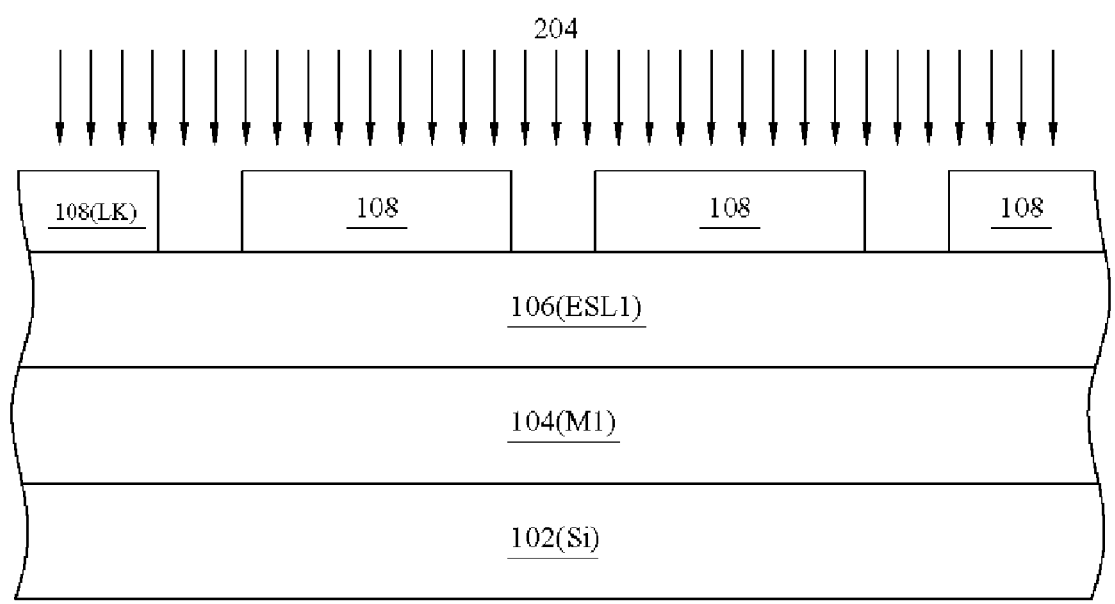

FIG. 2B illustrates the cross-sectional diagram of FIG. 2A after the etching of the low-K dielectric 108 has occurred as was previously described and also after the removal of the photoresist layer 202. A second etching occurs in FIG. 2B, such as through a dry etching by ion bombardment 204, to remove the etch-stop layer 106 within the contact holes 105. The etching will be selective to the etch-stop layer 106 relative to the underlying silicon substrate 102.

Figure 2C:
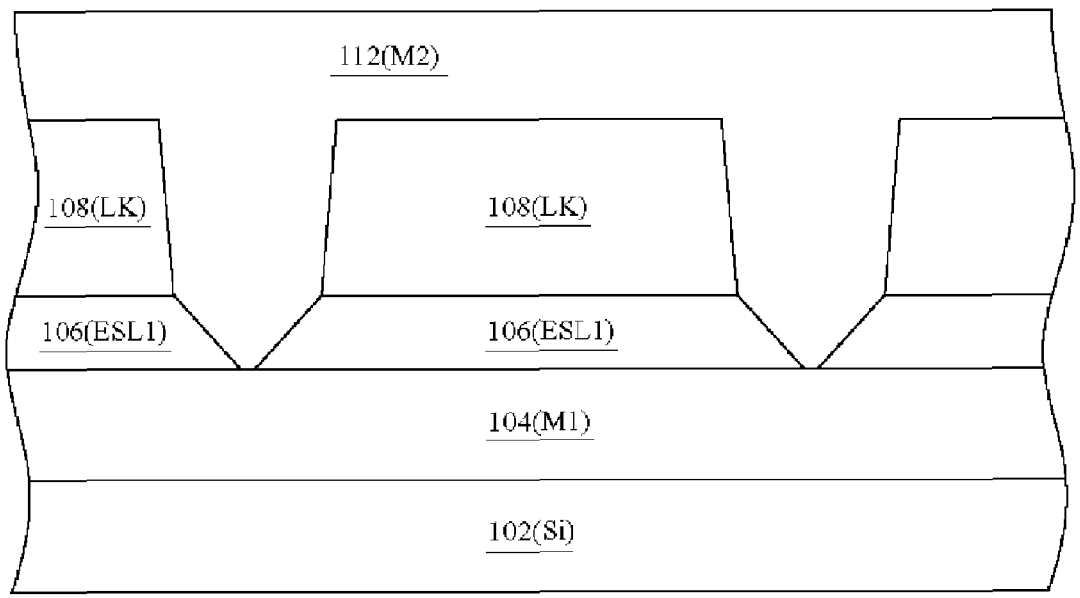

In FIG. 2C, another cross-sectional diagram is provided in which a second metal layer 112 has been deposited above the low-K dielectric 108 and into the contact holes 105. The profile of the etching has been changed somewhat as illustrated in this figure, to form more of tapered contact hole, such as might be formed if one or both of the etching of the low-K dielectric 108 and the etch-stop layer 106 had been by a wet, isotropic etch. Because, as is illustrated here, the etch-stop layer 106 remains between the low-K dielectric 108 and the silicon substrate 102, and because the chemical bonds between the etch-stop layer 106 and the other layers can sometimes be less strong than between other device layers, this area may be particularly susceptible to subsequent mechanical stresses.

Figure 2D:
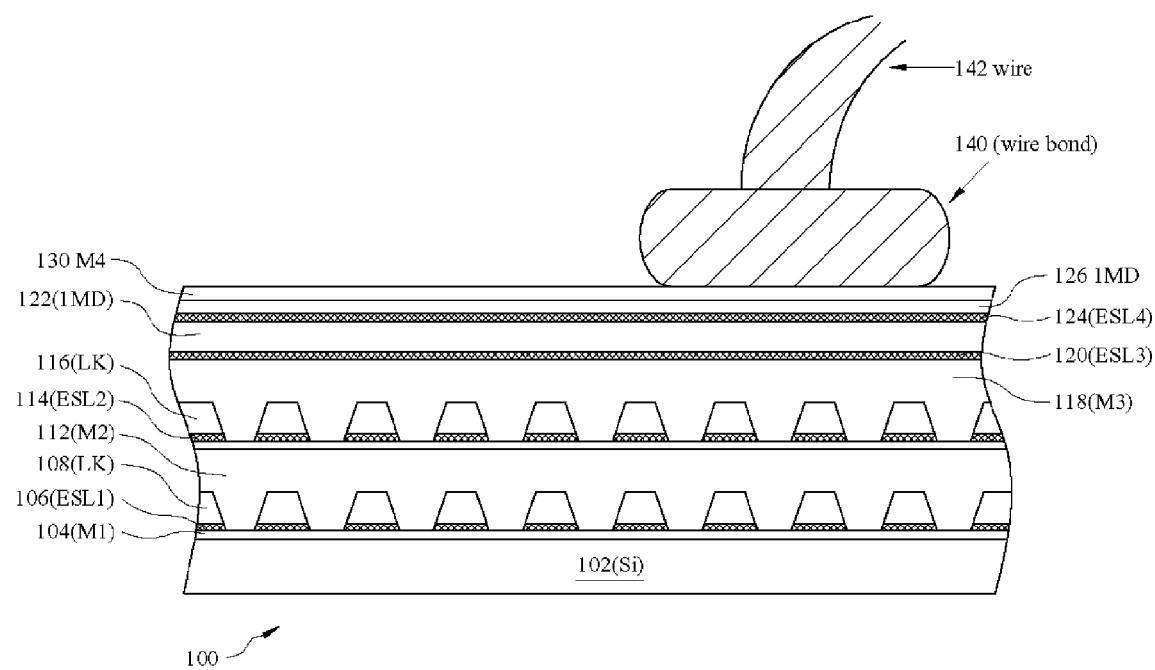

In FIG. 2D, a completed semiconductor structure 100 is shown, still absent the subsequently attached bonding elements 140 or packaging elements. The process that occurs between FIG. 2C and FIG. 2D is that multiple process steps will have occurred to deposit additional insulating layers between the metallic layers, vias will be formed between the various conductive layers or metallic layers, and etch-stop layers will have also been formed in order to selectively etch these vias or other semiconductor structures to appropriate depths. At each layer where an etch-stop layer exists, the semiconductor structure will be more vulnerable to peeling or other separating effects due to mechanical stresses.

Figure 3:
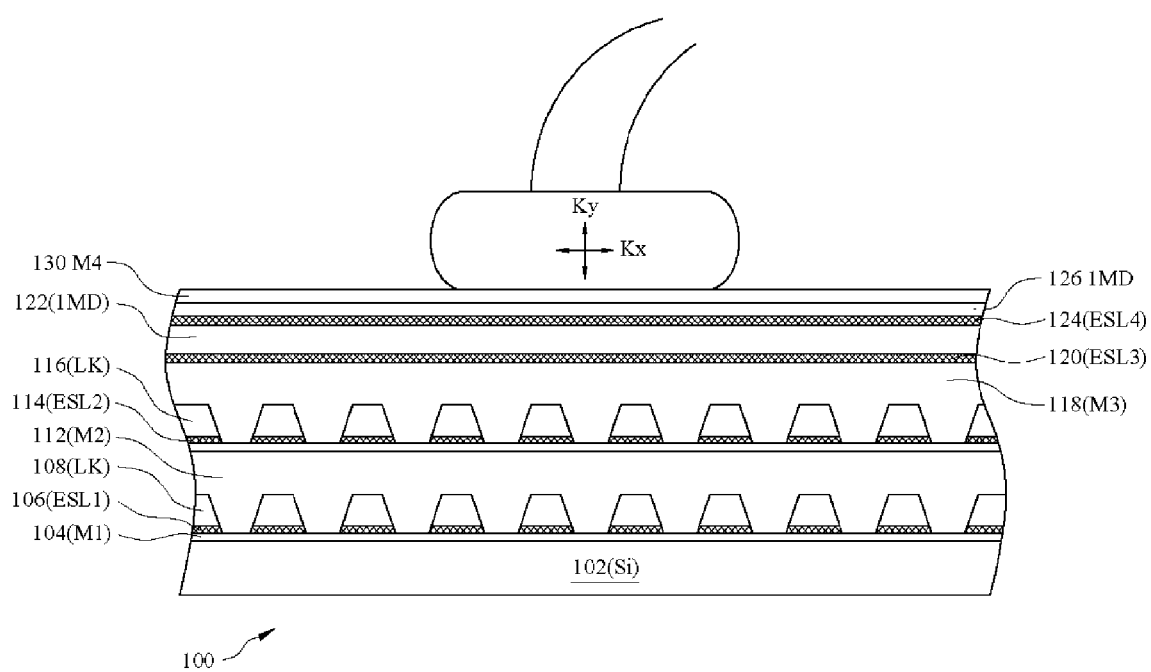
FIG. 3 is a partial cross-sectional diagram of a semiconductor device illustrating the mechanicals stresses placed upon the layers of the device.

FIG. 3 illustrates a portion of a semiconductor circuit such as shown in the proceeding figures with a wire bond 140 formed on it. The force vectors kx and ky illustrate the components of the physical forces that will be imparted onto the semiconductor device 100 by the physical connection provided through the bonding structure. As was previously discussed, typically these forces will become attenuated at farther distances from the bonding elements. This inverse relation between the distance from the bonding elements and the stress on the layers of the device 100, however, is a general rule, and the stress may not necessarily follow monotonically in decreasing order through the layers. For example, although in most cases the topmost layer will see the highest mechanical stress or pulling due to the bonding structure, in some instances the first layer may see a greater stress for example than the second layer. Or the third layer may see a greater stress or lesser stress than the second layer, and so the principles described in this application for mitigating these effects can be applied to the various layers according to the design needs.

Referring now to the completed device 100 as was described with respect to FIG. 1, the four etch-stop layers 106, 114, 120, and 124 all represent areas of vulnerability to peeling when the bonding elements impart physical stresses on the device. To address that these layers see differing stresses, with for example the top-most layer seeing the most stress, three of the etch-stop layers may be formed of silicon carbide (SiC), and the other (e.g., top-most) of the etch-stop layers may be formed of silicon oxide (SiO), silicon carbide oxide (SiCO), silicon carbide nitride (SiCN), silicon nitride ($Si_3N_4$), or compositions of carbide and nitride. The top-most etch-stop layer 124, in particular, may be designed of a different material and/or process so it will be most resistant to stress or peeling.

The division of structures and/or processes can be broken out according to design goals. For example, two of four layers may be one of the above-referenced materials and the other two layers can be another. The processes and materials used can be broken out in any combination depending on design goals, such as according to the relative stresses placed on the various layers within the stack. The top-most layer will likely see the highest mechanical stress. Accordingly, in certain embodiments the top etch-stop layer 124 may be optimized to have the strongest chemical bonds. Another possible structure for forming a multiple layer etch-stop semiconductor stack includes applying adhesive layers (e.g., 20–50 angstroms) between the etch-stop layers and other layers. Other processes can be used to enhance the chemical bonds between the etch-stop layers and other layers. For example, the process may include copper oxide (CuO) reduction–through hydrogen ($H_2$) or ammonia ($NH_3$) treatment. Other processes include copper nitride (CuN) formation through ammonia ($NH_3$) treatment. The layers may be deposited at 300 to 400° Celsius at a power of 150 to 800 watts. Using film deposition powers and pressure ranges commonly known to those in the industry, it may be desirable to use different processes to increase the chemical bond at one or more of the etch-stop layers 106, 114, 120, 124, such as by exposing one or more of the etch-stop layers to helium or argon in order to increase the layer's surface roughness. In addition, the etch-stop layers may also be exposed to single or any combinations of hydrogen, nitrogen, oxygen, ammonia, fluorine, $N_2O$ gas, or $CH_3$ gas. Other than gas treatments, the etch-stop layers may also undergo ion or e-beam bombardment.

Figure 4:
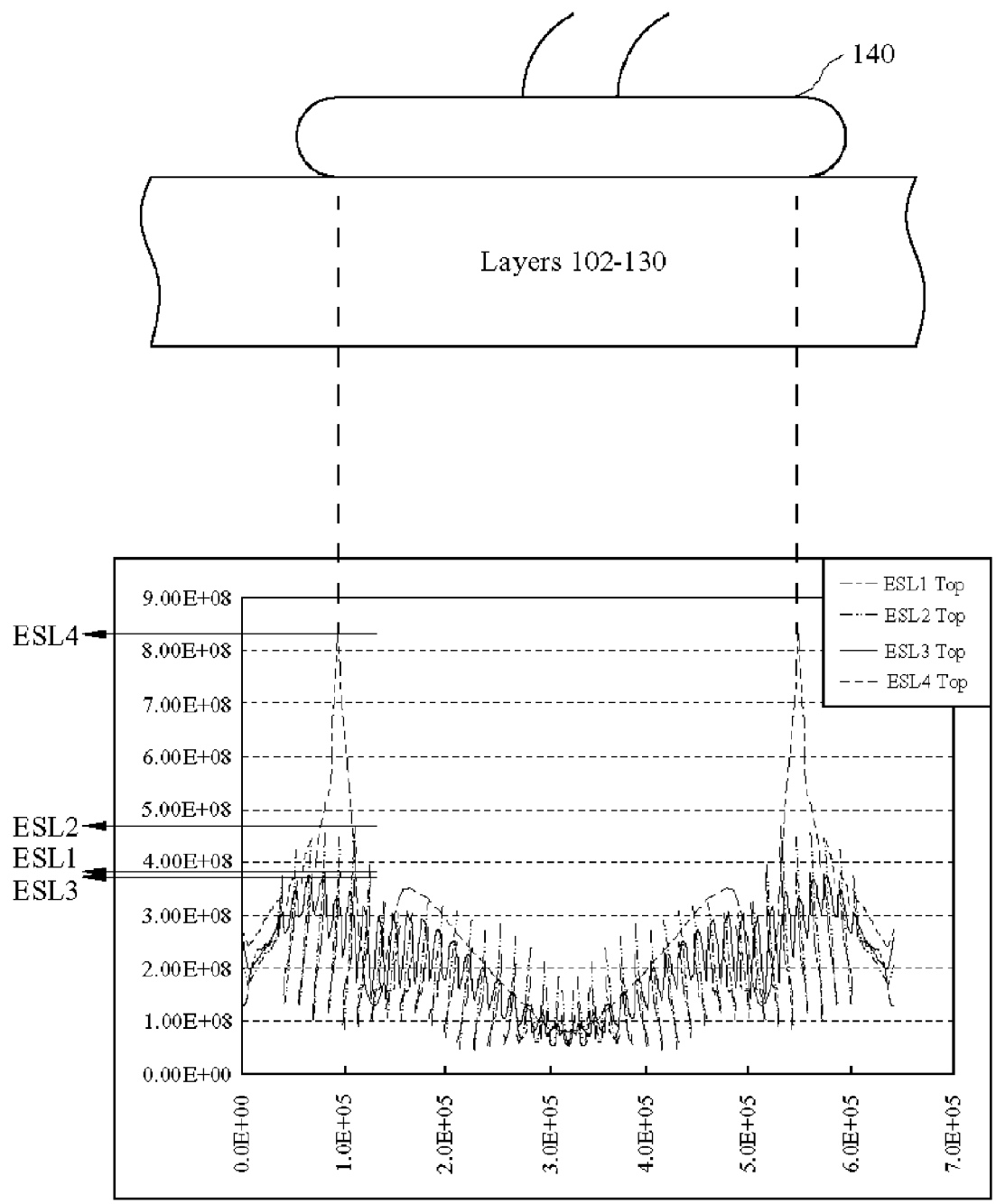
FIG. 4 is a force diagram graphing the forces placed on the various several etch-stop layers according to the position horizontally in the device.

FIG. 4 provides a stress diagram that illustrates both the importance of adapting the particular materials and/or methods for forming the etch-stop layers as well as that certain layers may be of greater importance for forming hardened or more tightly bonded etch-stop layers than other layers. For illustration purposes, the stress levels for all four etch-stop layers have been graphed relative to their x-position beneath the bonding pad 140. The specific stresses seen here are given just for illustration purposes; the described techniques can be used to more strongly compensate for the higher-level stresses seen in this case as being particularly on the fourth etch-stop layer ("ESL4") 124.

For example, in this figure there is a dramatic difference in imparted stress between the fourth etch-stop layer 124, which is the top-most etch-stop layer, and all of the remaining etch-stop layers 106, 114, 120. As illustrated in FIG. 4, this difference is approximately two-fold at the respective peak stresses. But, you will notice in this figure that the second etch-stop layer 114 actually sees a lower imparted stress level than does the first etch-stop layer. Thus, it may be desirable to ensure that a greater chemical bond is imparted on the first etch-stop layer 106 using some of the above-described techniques. The invention to be claimed here is not specific to the use of the differing processes in a rigid technique but to use those processes as necessary to best effect the most efficient and the most hardened semiconductor design.

While various embodiments in accordance with the principles disclosed herein have been described above, it should be understood that they have been presented by way of example only, and are not limiting. Thus, the breadth and scope of the invention(s) should not be limited by any of the above-described exemplary embodiment, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that can issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure.

Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions can be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A process for forming a multi-level metal semiconductor device having a bonding structure to electrically couple the semiconductor device to another component, the process comprising:

forming a first metal layer;

forming a first insulating layer over the first metal layer;

forming a first etch-stop layer between the first metal layer and first insulating layer, and having a substantially different strength of adhesion from both the first metal layer and the first insulating layer;

forming a second metal layer over the first insulating layer;

forming a second insulating layer over the second metal layer;

forming a second etch-stop layer between the second metal layer and the second insulating layer, and having a substantially different strength of adhesion from both the second metal layer and the second insulating layer, wherein the difference in strength of adhesion of the second etch-stop layer from the second metal layer and second insulating layer differs from the difference in strength of adhesion of the first etch-stop layer from the first metal layer and first insulating layer such that a greater chemical bond exists between the one of the first or second etch-stop layers and its adjacent metal and insulating layers that will undergo more mechanical stress therebetween caused by a connection from the other component to the bonding structure than the other of the first or second etch-stop layer and its adjacent metal and insulating layers; and forming a third metal layer over the second insulating layer.

2. A process according to claim 1, wherein the second etch-stop layer is formed to have a substantially greater strength of adhesion to its neighboring layers than does the first etch-stop layer.

3. A process according to claim 1, wherein the second etch-stop layer is formed of a different material than the first etch-stop layer.

4. A process according to claim 1, wherein the one of the first or second etch-stop layer is formed using hydrogen or nitride treatment.

5. A process according to claim 1, and further comprising forming an adhesive layer beneath or above the one of the first or second etch-stop layer.

6. A process according to claim 1, wherein the process of forming the second etch-stop layer is different from the process of forming the first etch-stop layer.

7. A process according to claim 6, and further comprising exposing the surface of the one of the first or second etch-stop layer or the surface of the layer immediately beneath it to helium or argon.

* * * * *